(12) United States Patent
Guitton et al.

(10) Patent No.: US 6,788,168 B2
(45) Date of Patent: Sep. 7, 2004

(54) INTEGRATED LOW-PASS OR BAND-PASS FILTER

(75) Inventors: Fabrice Guitton, Tours (FR); Choukri Karoui, La Riche (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 10/182,419

(22) PCT Filed: Nov. 30, 2001

(86) PCT No.: PCT/FR01/03803

§ 371 (c)(1),
(2), (4) Date: Jul. 29, 2002

(87) PCT Pub. No.: WO02/45263

PCT Pub. Date: Jun. 6, 2002

(65) Prior Publication Data

US 2003/0001693 A1 Jan. 2, 2003

(30) Foreign Application Priority Data

Nov. 30, 2000 (FR) .............................. 00 15523

(51) Int. Cl.⁷ ................................................ H03H 1/02
(52) U.S. Cl. ..................................... 333/170; 333/172
(58) Field of Search ................................ 333/134, 170, 333/172, 185, 12, 181

(56) References Cited

U.S. PATENT DOCUMENTS

| 4,806,944 A | | 2/1989 | Jacomb-Hood |
| 5,495,387 A | | 2/1996 | Mandai et al. |
| 5,760,662 A | | 6/1998 | Kalb et al. |
| 6,100,776 A | * | 8/2000 | Furutani et al. ............ 333/136 |
| 6,107,899 A | | 8/2000 | Taguchi et al. |

FOREIGN PATENT DOCUMENTS

DE 33 34817 A1 4/1985

OTHER PUBLICATIONS

International Search Report from PCT application No. PCT/FR01/03803 filed Nov. 30, 2001.
English translation of the International Preliminary Examination Report from priority application No. PCT/FR01/03803.

* cited by examiner

*Primary Examiner*—Robert Pascal
*Assistant Examiner*—Dean Takaoka
(74) *Attorney, Agent, or Firm*—Lisa K. Jorgenson; William R. McClellan; Wolf, Greenfield & Sacks, P.C.

(57) ABSTRACT

A filter is formed as an integrated circuit by resistive and capacitive elements and includes, for connection to ground, at least two separate pads of a chip designed to be connected individually to at least two separate terminals of a package.

31 Claims, 7 Drawing Sheets

INTEGRATED LOW-PASS OR BAND-PASS FILTER

BACKGROUND OF THE INVENTION

1. Field of the Invention

The present invention relates to the field of integrated filters, the passive components of which (resistors and capacitors) are formed in the same integrated circuit, arranged in a package.

An example of application of the present invention relates to high-frequency transmissions (for example, mobile telephony).

The present invention will be described in relation to an application to low-pass filters. It more generally relates to low-pass, band-pass, and composite filters.

2. Discussion of the Related Art

A disadvantage of conventional integrated filters is that their packaging degrades their frequency response.

Figure 1:
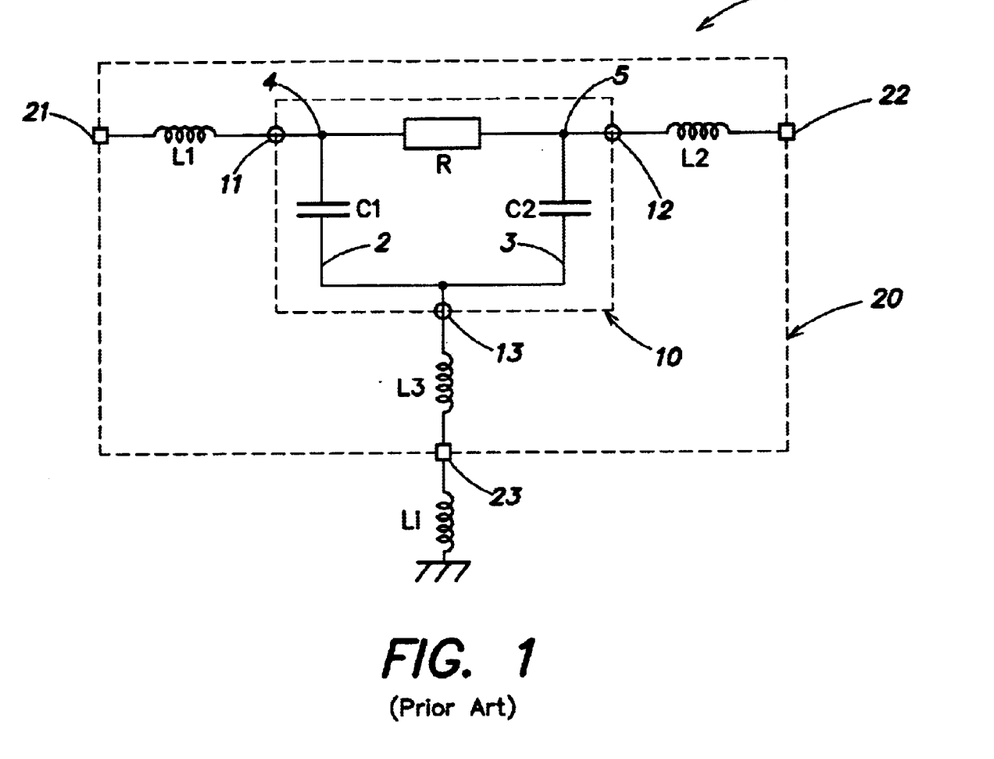
FIGS. 1 to 5, previously described, are intended for showing the state of the art and the problem to solve.

FIG. 1 shows an example of an equivalent electric diagram of a low-pass filter 1 made in the form of an integrated circuit and arranged in a package. The example of FIG. 1 relates to a so-called π filter, which includes two capacitive elements C1 and C2 having first electrodes 2 and 3 connected together to ground, and having second electrodes 4 and 5 forming the input-output terminals of the filter, connected to each other by a resistor R. Resistor R and capacitors C1 and C2 are integrated on a chip, symbolized by dotted lines 10 in FIG. 1, having two pads 11 and 12 corresponding to electrodes 4 and 5 and having one pad 13 corresponding to electrodes 2 and 3 of the capacitors. The cut-off frequency of this π filter is, with capacitors C1 and C2 of same value C, equal to $1/2\pi RC$.

In the packaging (symbolized by a stripe-dot line 20) of chip 10, each pad 11 and 12 is connected to a corresponding terminal 21 and 22 by a wire (for example, a gold wire), the parasitic inductance of which is symbolized by elements L1 and L2. On the side of terminal 13, the integrated circuit chip is generally provided on a so-called rear surface of a ground plane. The connection of pad 13 to a terminal 23 of package 20 has an equivalent inductance L3 corresponding to the series connection of the different parasitic inductances of connection to ground terminal 23. These parasitic inductances differ according to the type of package, but are always present.

A parasitic inductance Li of the printed circuit track on which the package is assembled and which connects terminal 23 to ground is present outside of the package. This inductance is in series with inductance L3.

Figure 2:
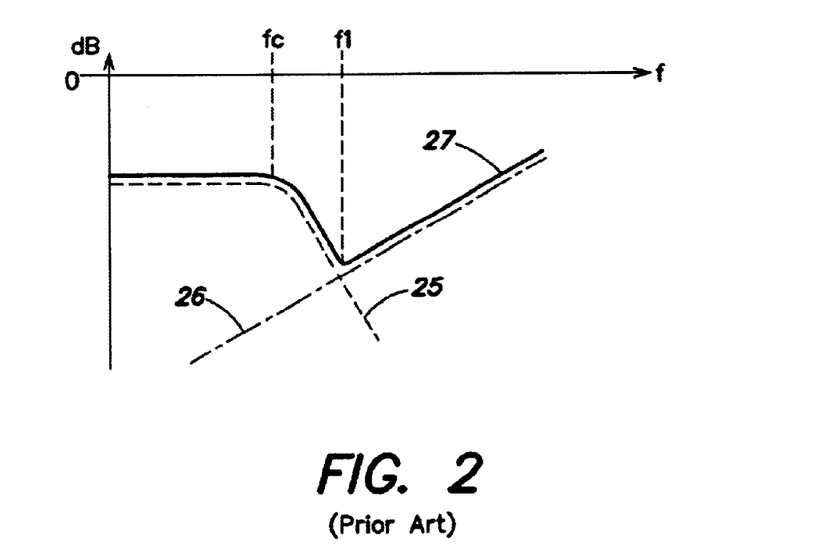

FIG. 2 shows the transfer function of the low-pass filter of FIG. 1, once assembled, illustrating its frequency response. It can be considered that the attenuation (curve in full line 27) of the filter as a function of frequency is obtained by superposing the characteristic of an ideal low-pass filter having a cut-off frequency fc (dotted lines 25) and the transfer function of the ground return inductance (stripe-dot line 26) corresponding to the sum of inductances L3 and Li. Thus, from a frequency f1 where curve 25 crosses curve 26, the filter attenuation decreases; the low-pass effect is then lost. The position of frequency f1 in the filter response of course depends on the sizing of the filter elements and, more specifically, on the respective values of capacitors C1 and C2 and of parasitic inductances L3 and Li. Inductance L3 generally is of several tenths of nanohenrys (between 0.2 and 0.8 nH).

The effect of the parasitic inductances is particularly disturbing for applications where the frequency spectrum to be cut-off extends to frequencies greater than some hundred MHz. Such is the case, for example, for mobile telephony or other continuous spectrum applications.

At such frequencies, the ground return impedance linked to inductances L3 and Li can no longer be neglected (the impedance of an inductance increases when the frequency increases). It can be considered that electrodes 2 and 3 of capacitors C1 and C2 are disconnected from the ground. These capacitors then are in series between terminals 4 and 5 and short-circuit resistor R (the capacitor impedance decreases when the frequency increases).

A current solution to reduce the effect of ground return parasitic inductances consists of increasing the access surface area between the integrated circuit chip and the ground. In practice, the number of connections between pad 13 of the integrated circuit chip (10, FIG. 1) and ground connection terminal 23 is increased.

Figure 3:
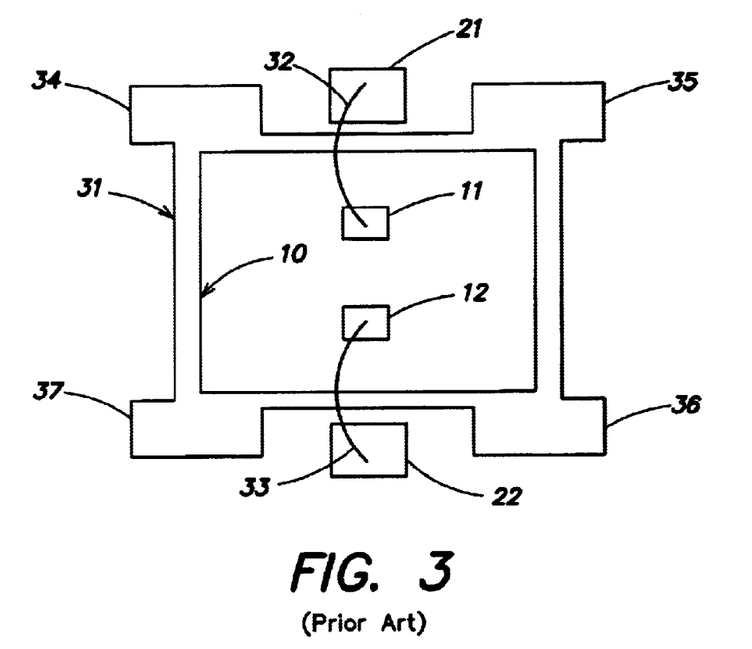
Figure 4:
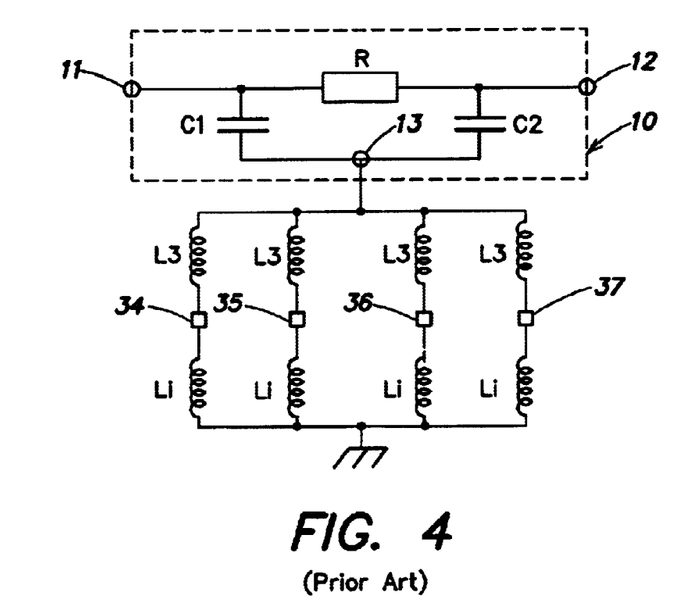

FIGS. 3 and 4 illustrate, respectively in a very simplified top view and as an equivalent electric diagram, a conventional example of an integrated circuit implementing this conventional solution. In the example of FIG. 3, it is assumed that integrated circuit chip 10 is laid, by its ground plane, on a lead frame 31. Pads 11 and 12 of the chip are connected, by wires 32 and 33, to respective terminals 21 and 22 of the package. For the ground connection, four terminals 34, 35, 36 and 37 of the package, which are connected to the central portion of lead frame 31, and thus to the ground plane of chip 10, are provided in this example. The ground connection corresponds the parallel connection of several (here, 4) series connections of inductances L3 and Li (inductances Li generally being different from one another). The first respective terminals of inductances L3 are connected together to pad 13 of chip 10. Inductances L3 are thus all connected to common electrodes 2 and 3 of capacitors C1 and C2 of the filter. The second respective terminals of inductances L3 are individually connected to terminals 34 to 37 of the package. Outside of the package, each terminal 34 to 37 is grounded by a parasitic inductance Li of the printed circuit track.

Although not shown in FIG. 4, parasitic inductances L1 and L2 of connection of input-output pads 11 and 12 of chip 10 are of course present.

Figure 5:
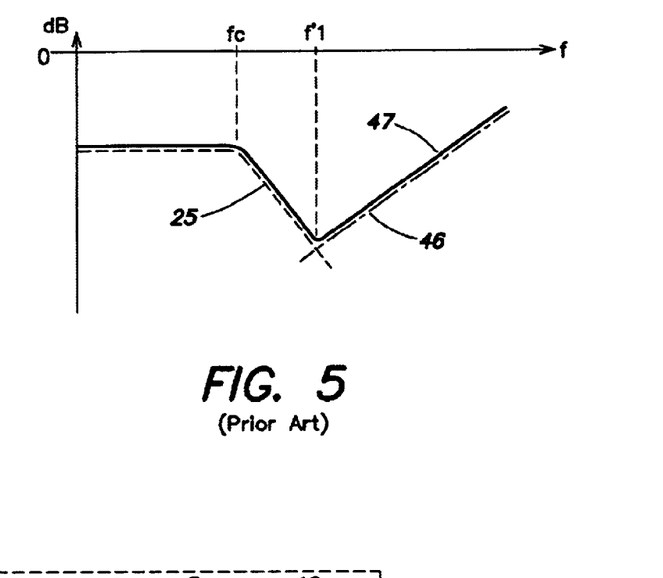

FIG. 5 illustrates the frequency response of the filter of FIGS. 3 and 4, once assembled. The general outlook of the characteristic is identical to that of FIG. 2. The general response (curve in full line 47) still corresponds to the superposition of the response of an ideal filter (curve in dotted lines 25) and of an inductance (curve in strip-dot lines 46). As compared to FIG. 2, the only contribution is the slight shift in the frequency f'1 at which the attenuation starts decreasing towards higher frequencies. This results from the parallel connections of inductances L3+Li. For a given package and assembly, there is no reason for inductances L3 and Li to be much smaller than in the case of FIGS. 1 and 2. Accordingly, considering that the parasitic inductances of connection of terminal 13 to terminals 34, 35, 36, and 37 have the same value L3 and that inductances Li are identical, the resulting parasitic inductance is approximately divided by four with respect to the case of FIG. 2. Frequency f'1 is then shifted by one octave (for example, from 100 MHz to 200 MHz).

The fact of multiplying the ground access terminals reduces, by the parallel connection of inductances, the resulting parasitic inductance of connection to ground.

However, the benefit of such a solution remains in practice limited, due to the poor efficiency obtained, that is, to the low ratio between the resulting decrease in parasitic inductance and the necessary increase in surface area (more specifically, the increase in the number of package terminals). Further, the effect of the short-circuiting of resistor R by the disconnection from the ground of capacitors C1 and C2 remains.

SUMMARY OF THE INVENTION

The present invention aims at overcoming the disadvantages of known filters formed in integrated circuits. The present invention more specifically aims at providing a novel low-pass or band-pass filter structure that reduces or minimizes the prejudicial effects of parasitic inductances linked to the ground connection of the filter.

The present invention also aims at providing a solution which is compatible with all known integration and packaging techniques.

The present invention further aims at providing a solution that can be implemented whatever the electric diagram used to integrate the low-pass or band-pass filter.

To achieve these and other objects, the present invention provides a filter formed as an integrated circuit by means of resistive and capacitive elements of a chip, intended for being individually connected to at least two separate terminals of a package.

According to an embodiment of the present invention, each capacitive element of the filter is formed of several capacitors individually connected to distinct pads of the chip, said pads being individually connected to distinct terminals of the integrated circuit package for connection to ground.

According to an embodiment of the present invention, the number of capacitors forming each capacitive element is chosen according to a desired number of resonance frequencies in the filter response.

According to an embodiment of the present invention, the filter includes, in series with each capacitor constitutive of a capacitive element, an inductive element taking part in the creation of a resonant circuit with a parasitic inductance of connection of the corresponding pad to the package.

According to an embodiment of the present invention, the filter includes, associated with each ground connection pad, a resistive element.

According to an embodiment of the present invention, the value of the resistive elements is a function of the maximum attenuation level desired for the filter response.

According to an embodiment of the present invention, the filter applies to a continuous frequency spectrum.

According to an embodiment of the present invention, the filter implements a low-pass filtering function.

According to an embodiment of the present invention, the filter implements a band-pass filtering function.

The foregoing and other objects, features and advantages of the present invention, will be discussed in detail in the following non-limiting description of specific embodiments in connection with the accompanying drawings, in which:

The same elements have been designated with the same references in the different drawings. For clarity, only those elements of the integrated circuits and of the packages which are necessary to the understanding of the present invention have been shown in the drawings and will be described hereafter.

Figures 6, 6A:
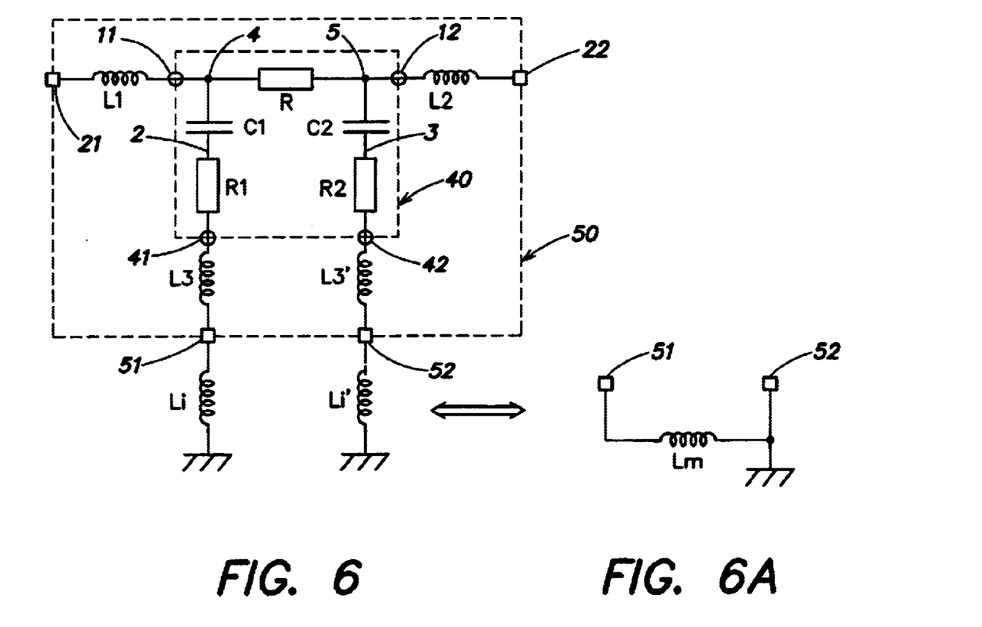
FIG. 6 shows the equivalent electric diagram of a first embodiment of a low-pass filter according to the present invention.
FIG. 6A shows the equivalent diagram of a detail of FIG. 6.
Figure 7:
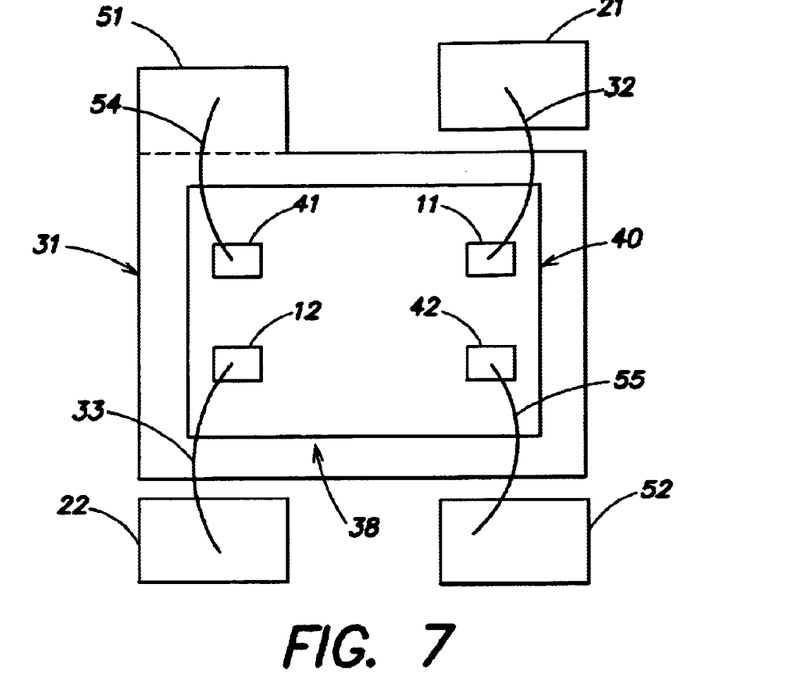
FIG. 7 very schematically shows a top view of an integrated circuit in a package containing the low-pass filter of FIG. 6.
Figure 8:
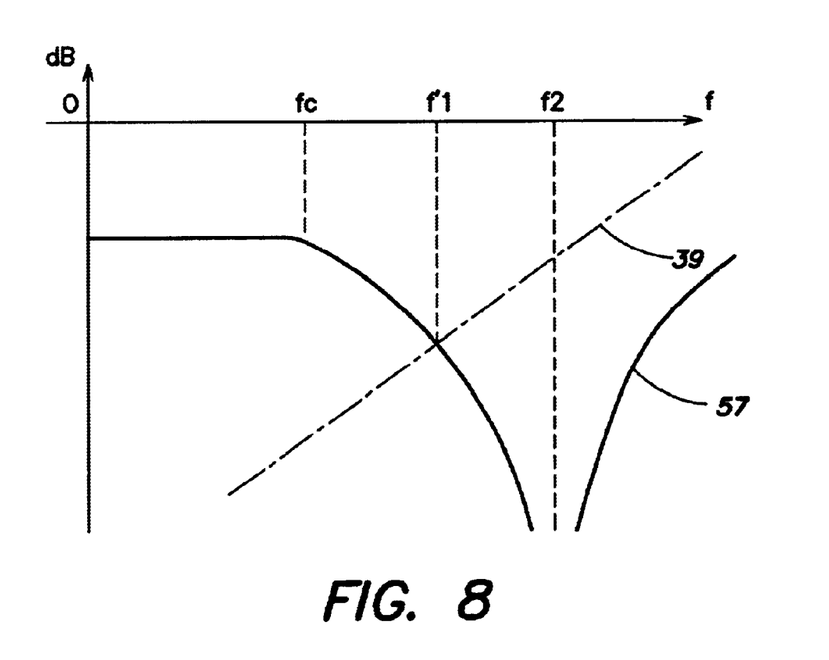
FIG. 8 illustrates the frequency response of the filter of FIG. 6.

FIGS. 6 to 8 illustrate a first embodiment of a low-pass filter according to the present invention wherein the ground connections are dissociated from the very inside of the filter structure. FIG. 6 is an equivalent electric diagram of a $\pi$ filter according to the present invention, formed in an integrated circuit 40 and arranged in a package 50. FIG. 7 is a very simplified partial top view of the chip and of the package before encapsulation according to an embodiment of the present invention. FIG. 8 shows the frequency response of the low-pass filter of FIG. 6, compared to those of the filters of FIGS. 1 and 4.

As previously, the $\pi$ low-pass filter includes a resistor R associated with two capacitors C1 and C2. Terminals 4, 5 of resistor R define input-output terminals of the filter, connected to pads 11, 12 of chip 40. Pads 11, 12 are connected to terminals 21, 22 of package 50 by conductive wires (for example, gold wires) 32 and 33 (FIG. 7) symbolized in FIG. 6 by parasitic inductances L1 and L2.

A feature of the present invention is that the respective electrodes 2 and 3 of capacitors C1 and C2 which are opposite to resistor R are no longer connected to a common pad or ground plane of the chip, but are individually connected to pads 41 and 42, which are intended for being individually connected to terminals 51 and 52 of package 50. In FIG. 7, pads 41 and 42 are connected to terminals 51 and 52, for example, by conductive wires 54 and 55. However, the present invention finds a particular interest in a "flip-chip" assembly, where the front surface of the chip is positioned, through connection balls, on a printed circuit.

DETAILED DESCRIPTION

In the example of FIG. 7, the rear surface of chip 40 rests on a central portion 38 of a lead frame 31, ground connection pads 41 and 42 are formed on the front surface, and electrodes 2 and 3 are isolated from the rear surface. Accordingly, the presence or the absence of a ground plane at the rear surface of the chip has no further effect on the filter operation. Indeed, even though, as illustrated in FIG. 7, terminal 51 is connected to central portion 38 of lead frame 31, the equivalent electric diagram is that of FIG. 6: inductances L3 and L3' are respectively in series between each of the capacitors and the corresponding terminal 51 or 52 of the package. Outside of the package, each terminal 51, 52 is connected to ground by an inductance Li, Li', respectively.

When two distinct terminals 51 and 52 of the package rather than a common terminal connect inductances L3, as illustrated in FIG. 6A, a parasitic inductance Lm, due to the ground connection paths on the printed circuit, connects terminals 51 and 52. Inductance Lm dissociates the voltages of nodes 51 and 52. Since, further, terminals 51 and 52 are connected to distinct pads of chip 40, the grounds of the filter input and output signals are dissociated.

The dissociation of the input and output grounds avoids a serial connection, at high frequencies, of capacitors C1 and C2 between the input and output terminals of the filter due to the high impedance of the parasitic inductances at that time. This is a significant difference with respect to the conventional solution which only multiplies the package ground terminals (FIGS. 4 and 5). Indeed, in the conventional solution, since the parasitic impedances are in parallel between terminal 13 and the ground, this always comes down to an equivalent diagram of an inductance connecting a common electrode of the capacitors to ground. This equivalent diagram is, according to the present invention, modified.

The fact, according to the present invention, of separating the ground connections inside the package amounts, as illustrated in FIG. 6, to creating two series resonant circuits LC on either side of resistor R.

FIG. 8 illustrates the attenuation-frequency characteristic of the filter of FIG. 6. This characteristic starts with that of a low-pass filter having a cut-off frequency fc. Then, for high frequencies, the effect of the LC circuits is being felt. The attenuation thus decreases from a frequency f2 much greater than frequency f'1 of the conventional case, as shown by curve 57. For comparison, the portion of the response of a conventional filter of FIG. 5 due to the ground return inductances has been illustrated by stripe-dot line 39. The interval between frequencies f'1 and f2 is very large, the frequency scale being logarithmic. For example, assuming values L3, L3', and Li, Li' of the same order of magnitude as values L3 and Li of FIGS. 2 and 5, frequency f2 is shifted to around one GHz.

Preferably, a resistor of low value (for example, a few tens of ohms, or even less), respectively R1 or R2, is connected in series with capacitor C1, respectively C2. Resistors R1 and R2 adversely affect the quality factor of the ground return inductances (L3+Li and L3'+Li') and attenuate the resonance amplitude. If resistors R1 and R2 are provided, they are, preferably, integrated in circuit 40. The choice of the values of resistors R1 and R2 depends on the desired filter attenuation.

An advantage of the present invention is that by providing dissociation or separation, within the package, of the ground connections, at least one high resonance frequency is introduced, which very clearly puts off the degradation of the attenuation. The general response of the obtained low-pas filter is thus improved.

Another advantage of the present invention is that the cut-off frequency of the low-pass filter is not modified. Indeed, it is only linked to the values of capacitors C1 and C2 and of resistor R, as in the conventional filter.

Figure 9:
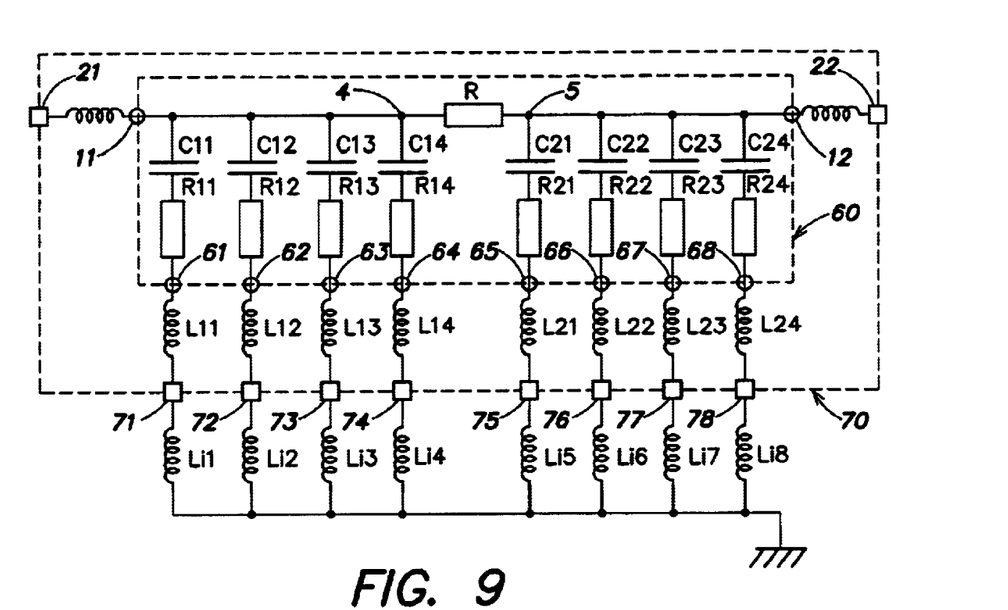
FIG. 9 shows the equivalent electric diagram of a second embodiment of a low-pass filter according to the present invention.

FIG. 9 shows the equivalent electric diagram of a low-pass filter according to a second embodiment of the present invention. According to another feature of the present invention, the series resonant circuits are divided up. Thus, each capacitive element of the low-pass filter is formed of several capacitors C11, C12, C13, and C14, respectively C21, C22, C23, and C24. Capacitors C11 to C14 are connected together by a first electrode to terminal 4 of resistor R defining first pad 11 of integrated circuit 60. Capacitors C21 to C24 have, similarly, a common electrode connected to terminal 5 of resistor R defining pad 12 of the integrated circuit.

The other electrodes of the different capacitors are individually connected to pads 61, 62, 63, 64, 65, 66, 67 and 68 of chip 60, intended for being individually connected to ground terminals 71, 72, 73, 74, 75, 76, 77, 78 of package 70. In the example of FIG. 9, four series RLC circuits are parallel connected on either side of resistor R. An advantage of dividing up the capacitors to obtain series resonant circuits, in parallel, is that, by judiciously choosing the respective values of capacitors C11 to C14 and C21 to C24, different resonance frequencies which push back towards higher frequencies the reduction of the filter attenuation are obtained. This effect is obtained without modifying the cut-off frequency fc of the filter, provided that the sum of the values of the capacitors associated in parallel corresponds to the capacitance desired for the cut-off frequency.

Outside package 60, each terminal 71 to 78 is connected to ground by a parasitic inductance Li1 to Li8.

Figure 10:
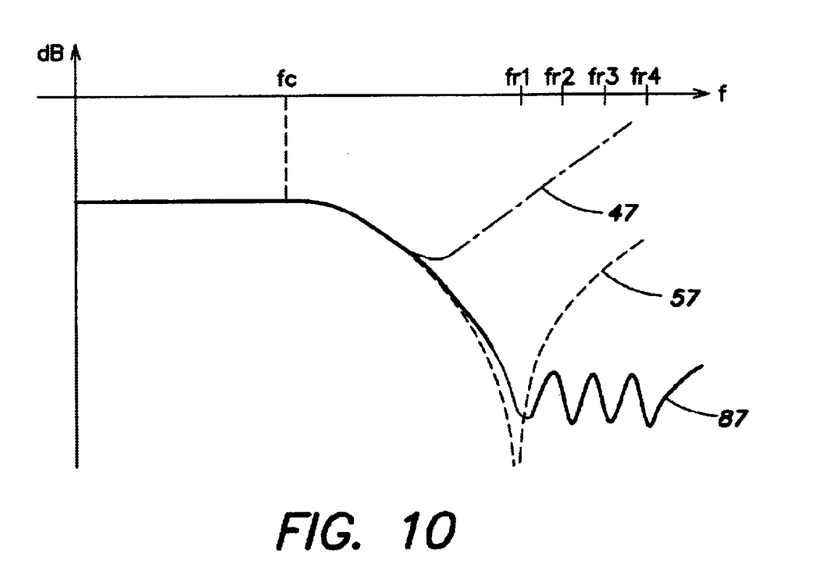
FIG. 10 illustrates the frequency response of the low-pass filter of FIG. 9.

FIG. 10 shows the frequency response 87 of a filter such as shown in FIG. 9, compared to the respective frequency responses 47 and 57 of the filters of FIGS. 4 and 6.

As illustrated in FIG. 10, four resonance frequencies fr1, fr2, fr3, and fr4 are obtained in the filter response before the attenuation is definitively degraded. The number of resonance frequencies in the attenuation-frequency characteristic of the filter depends on the number of capacitors placed in parallel. The amplitude of the oscillations in the filter response between the different resonance frequencies depends on the values of resistors R11, R12, R13, R14, R21, R22, R23, and R24 provided, preferably, in series with the different capacitors. The respective parasitic inductances L11, L12, L13, L14, and L21, L22, L23, L24 are approximately the same. Indeed, the respective connections between the pads of chip 60 and the terminals of package 70 are performed, for a given package assembly technology, in the same way. Thus, the effect of the multiplication of the resonant circuits, which causes a widening of the range of frequencies attenuated by the filter, only depends on the number of capacitors provided in parallel.

As compared to the case of FIG. 7, the fact of having several RLC circuits in parallel with different resonant frequencies provides a "mesa" with a very strong attenuation.

The present invention not only pushes away the frequencies for which the attenuation is altered, but it also improves the attenuation in the attenuated frequency range. Referring to the example of FIGS. 2 and 5, the last resonance frequency fr4 is pushed back to several GHz.

For the different capacitors, values enabling an approximately regular frequency interval between the different resonance frequencies fr1, fr2, fr3, and fr4 will preferably be chosen. It will be ascertained that the resistors, placed in series with the different capacitors, have sufficiently low values to maintain the filtering effect.

According to an alternative not shown, not all pads 61 to 68 of chip 60 correspond to a terminal 71 to 78 of the package. However, at least one terminal is provided on either side of resistor R to maintain the dissociation of the input and output grounds of the filter.

Figure 11:
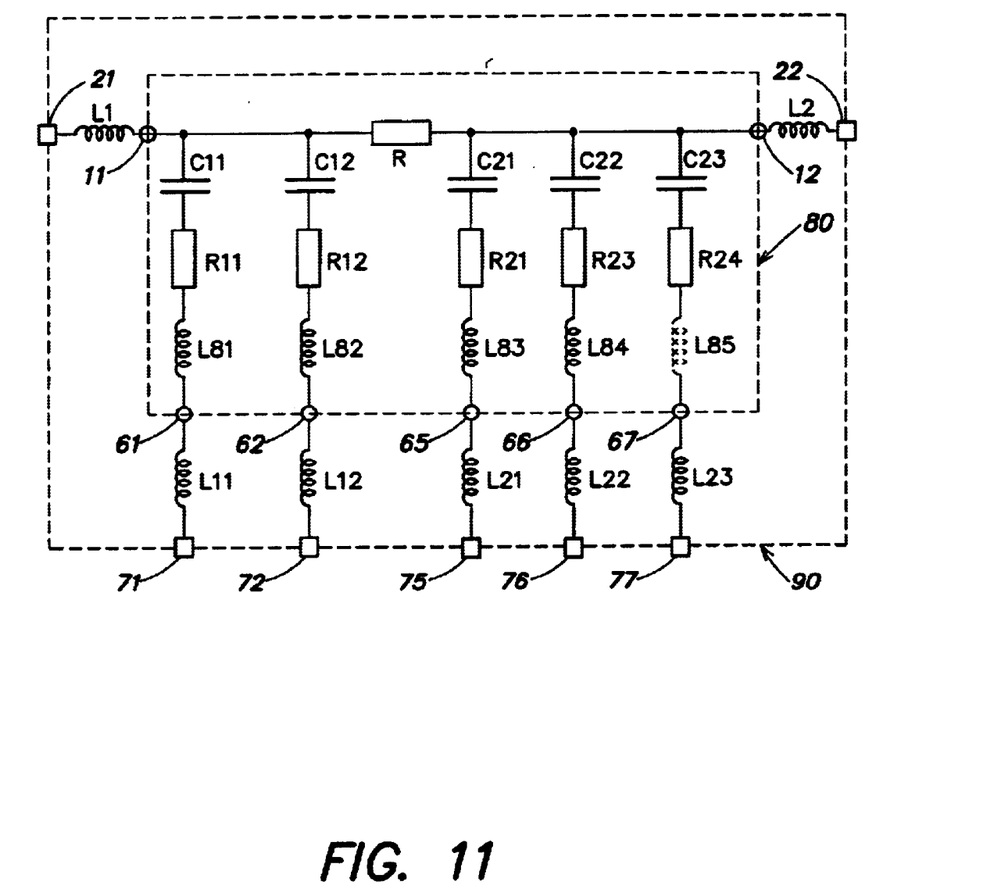
FIG. 11 shows the equivalent electric diagram of a third embodiment of a low-pass filter according to the present invention.

FIG. 11 shows the equivalent electric diagram of a low-pass filter according to a third embodiment of the present invention. This third embodiment has two differences with respect to the previously-described embodiment.

A first difference is that a different number of series resonant RLC circuits is provided on either side of resistor R of the low-pass filter. In the embodiment of FIG. 11, two capacitors C11 and C12 are provided on the side of pad 11 of the filter and three capacitors C21, C22, and C23 are provided on the side of pad 12 of integrated circuit 80. Resistors R11, R12, and R21, R23, and R24 are preferably provided in series with these different capacitors. This dissymmetry in the resonant circuits modifies the filter response in the resonance frequency range.

A second difference is that a part of the inductances of the resonant circuit is integrated. If the different capacitors have the same values, different resonance frequencies are obtained by integrating in chip 80 inductances L81, L82, L83, L84, and L85 having different values. Of course, pads 61, 62, 65, 66, and 67 remain connected to respective terminals 71, 72, 75, 76, 77 by parasitic inductances L11, L12, L21, L22, L23 representing the parasitic inductances due, essentially, to the connections of the pads with the terminals of package 90. Similarly, although not shown, parasitic inductances are always present outside of the package, between each terminal 71, 72, 75, 76, 77 and the ground. Inductance L85 has been shown in FIG. 11 in dotted lines to illustrate its optionality. Indeed, since the values of the inductances are here individualized, the inductive element of the resonant circuit to which capacitor C23 belongs may be provided to be only formed by parasitic inductance L23.

Of course, in the embodiment of FIG. 11, the respective positions of the series integrated capacitors, resistors, and inductances is of no importance. However, in the preceding embodiments, since the resistors are integrated to chips 40 and 60, these resistors are necessarily connected to the corresponding capacitors. However, even in these embodiments, the resistors may be connected to one or the other of the terminals of these capacitors in the series connection.

As an alternative, an alteration of the quality factor of the different inductances may be obtained, in the case where they are at least partially integrated. The use of separate resistors is thus avoided.

Figure 12:
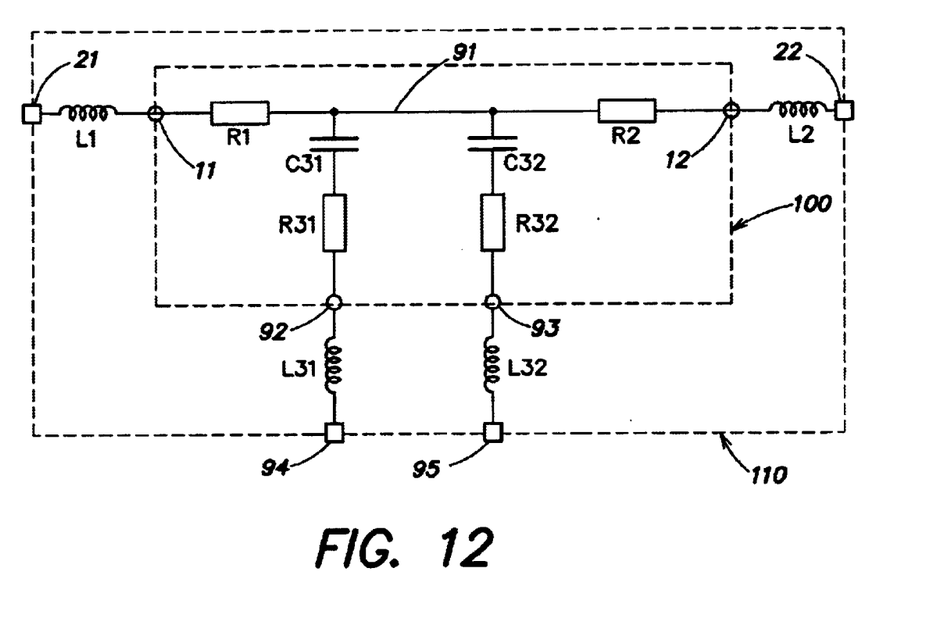
FIG. 12 shows the equivalent electric diagram of another embodiment of a low-pass filter structure according to the present invention.

FIG. 12 shows the equivalent diagram of a fourth embodiment of a low-pass filter according to the present invention. This embodiment is intended for illustrating that the present invention applies to other forms of filters as the π filter. The embodiment of FIG. 10 illustrates a "T" filter including two resistors R1 and R2 in series between two terminals 11, 12, defining input-output pads of the filter and of chip 100. In a conventional T filter, midpoint 91 of the series connection of resistors R1 and R2 is connected to ground by a capacitor. According to the present invention, at least two capacitors C31 and C32 connected, by their first electrodes, to midpoint 91, are provided. The second electrodes of capacitors C31 and C32 are individually connected to pads 92 and 93 of chip 100, themselves being individually connected to terminals 94 and 95 of package 110. Parasitic inductances L31 and L32 (and parasitic inductances external to the package which have not been shown) form, with respective capacitors C31 and C32, series resonant circuits. As previously, resistors R31 and R32 are preferably provided in series in the resonant circuits.

The operation and the advantages provided by the present invention in the implementation of a "T" filter can be deduced from the explanations previously given in relation with the π filter.

Figure 13:
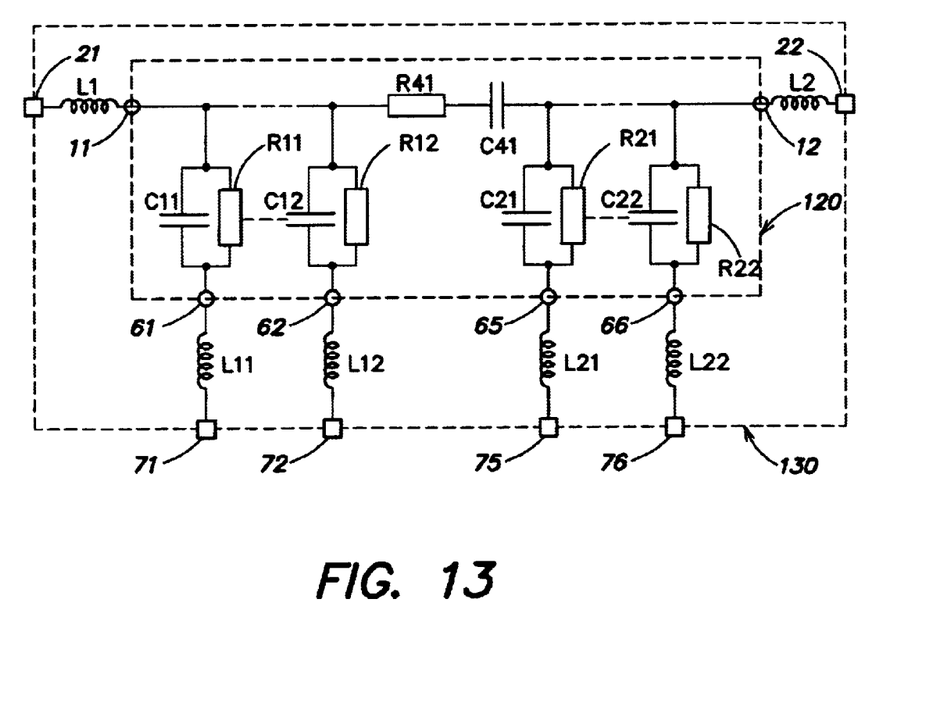
FIG. 13 shows the equivalent electric diagram of an embodiment of a band-pass filter according to the present invention.

FIG. 13 shows another embodiment of the present invention applied to a band-pass filter. In the example of FIG. 13, the band-pass filter conventionally includes a series RC circuit including a capacitor C41 and a resistor R41 between input-output pads 11 and 12 of chip 120. These input-output pads are intended for being connected to ground by parallel RC circuits. According to the present invention, several parallel RC circuits are provided on either side of resistor R41 and of capacitor C41, to introduce several resonance frequencies in the filter response. Still according to the present invention, these different parallel RC circuits are individually connected to terminals 71, 72, 75, and 76 of package 130. Thus, pads 61, 62, 65, and 66 individually connected to an end of the different RC circuits are provided. For example, a first circuit, comprising a resistor R11 in parallel with a capacitor C11, is connected between pad 11 and pad 61 and a second circuit, comprising a capacitor C12 in parallel with a resistor R12, is connected between pad 11 and a pad 62. On the side of pad 12, a first RC circuit comprises a capacitor C21 in parallel with a resistor R21 and a second RC circuit comprises a capacitor C22 in parallel with a resistor R22. The different resonant circuits of the present invention include, in addition to the RC circuits, parasitic inductances L11, L12, L21, and L22 of connection of respective pads 61, 62, 65, and 66 of chip 120 to respective terminals 71, 72, 75, and 76 of package 130.

Of course, as in the case of a low-pass filter, it may be provided to partially integrate to chip 100 part of the inductances of the resonant circuits.

In the application to a band-pass filter, the amplitude limitation of the oscillations between the resonance frequencies is obtained by the different resistors of the resonant circuits.

Of course, the present invention is likely to have various alterations, modifications, and improvements which will readily occur to those skilled in the art. In particular, the capacitances, resistances, and inductances of the filters of the present invention will depend on the application and on the desired type of filter. Further, the values of these capacitors will take into account the minimum inductance of the inductances with which they are connected in series, and which depends on the package in which the integrated circuit is to be arranged. On this regard, for a given type of package, those skilled in the art are able to find the value of the parasitic inductances of this package.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. An integrated circuit filter on an integrated circuit chip, the filter comprising by resistive and capacitive elements, and including at least two distinct pads of the integrated circuit chip for connection to ground, the at least two distinct pads of the integrated circuit chip capable of being individually connected to at least two separate terminals of an integrated circuit package, and further being connected separately to different ones of the resistive or capacitive elements of the integrated circuit filter.

2. The filter of claim 1, wherein each capacitive element of the filter is formed of several capacitors individually connected to distinct pads of the chip, said pads being individually connected to distinct terminals of the integrated circuit package for connection to the ground.

3. The filter of claim 2, wherein a number of capacitors forming each capacitive element is chosen according to a desired number of resonance frequencies in the filter response.

4. The filter of claim 2, including, in series with each capacitor of a capacitive element, an inductive element taking part in the creation of a resonant circuit with a parasitic inductance corresponding to the connection of the corresponding pad to the package.

5. The filter of claim 1, including, associated with each ground connection pad, a resistive element.

6. The filter of claim 5, wherein the value of the resistive elements is a function of a maximum attenuation level desired for the filter response.

7. The filter of claim 1, applied to a continuous frequency spectrum.

8. The filter of claim 1, implementing a low-pass filtering function.

9. The filter of claim 1, implementing a band-pass filtering function.

10. An integrated filter comprising:
   a filter circuit on an integrated circuit chip, the filter circuit including at least two capacitive elements configured for separate connection to ground; and
   at least two distinct pads on the integrated circuit chip, each of the pads being separately connected to a respective one of the capacitive elements of the filter circuit.

11. An integrated filter as defined in claim 10, further including an integrated circuit package having at least two distinct terminals, wherein the distinct pads on the integrated circuit chip are separately connected to the distinct terminals of the integrated circuit package.

12. An integrated filter as defined in claim 10, wherein a resistor is connected in parallel with at least one of the capacitive elements.

13. An integrated filter as defined in claim 11, wherein the filter circuit has a low pass characteristic.

14. An integrated filter as defined in claim 11, wherein the filter circuit has a band pass characteristic.

15. An integrated filter as defined in claim 11, wherein at least one of the capacitive elements comprises two or more capacitors separately connected to distinct pads of the integrated circuit chip, said pads being separately connected to distinct terminals of the integrated circuit package.

16. An integrated filter as defined in claim 15, wherein the capacitors are configured to produce two or more different resonance frequencies.

17. An integrated filter as defined in claim 15, further comprising an inductor connected in series with one or more of the capacitors.

18. An integrated filter as defined in claim 17, wherein the inductors are fabricated on the integrated circuit chip.

19. An integrated filter as defined in claim 10, wherein a resistor is connected in series with at least one of the capacitive elements.

20. An integrated filter comprising:
   a filter circuit on an integrated circuit chip, the filter circuit including at least two elements configured for separate connection to ground; and
   at least two distinct pads on the integrated circuit chip for connection of the filter circuit to ground, each of the distinct pads being separately connected to a respective one of the elements of the filter circuit.

21. An integrated filter as defined in claim 20, wherein the element of the filter circuit comprises a capacitive element.

22. A method for making an integrated filter on an integrated circuit chip, comprising:
   fabricating on the integrated circuit chip a filter circuit including at least two capacitive elements configured for separate connection to ground;
   providing at least two distinct pads on the integrated circuit chip for connection of the capacitive elements; and
   separately connecting each of the pads to a respective one of the capacitive elements.

23. A method as defined in claim 22, wherein fabricating a filter circuit includes fabricating at least one of the capacitive elements as two or more capacitors and separately connecting each of the capacitors to a distinct pad of the integrated circuit chip.

24. A method as defined in claim 22, wherein fabricating a filter circuit includes connecting a resistor in series with at least one of the capacitive elements.

25. A method as defined in claim 22, wherein fabricating a filter circuit includes connecting a resistor in parallel with at least one of the capacitive elements.

26. A method as defined in claim 22, wherein fabricating a filter circuit includes fabricating a filter circuit having a low pass characteristic.

27. A method as defined in claim 22, wherein fabricating a filter circuit includes fabricating a filter circuit having a band pass characteristic.

28. A method as defined in claim 23, further including selecting the capacitors to produce at least two different resonance frequencies.

29. A method as defined in claim 23, wherein fabricating a filter circuit includes connecting an inductor in series with one or more of the capacitive elements.

30. A method as defined in claim 23, wherein fabricating a filter circuit includes fabricating inductors on the integrated circuit chip and connecting the inductors in series with respective ones of the capacitive elements.

31. A method as defined in claim 22, further comprising separately connecting each of the pads to distinct terminals of an integrated circuit package.

* * * * *